(12) United States Patent
Lou

(10) Patent No.: US 10,276,641 B2
(45) Date of Patent: Apr. 30, 2019

(54) DISPLAY PANEL AND DISPLAY DEVICE

(71) Applicant: SHANGHAI TIANMA MICRO-ELECTRONICS CO., LTD., Shanghai (CN)

(72) Inventor: Junhui Lou, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/907,207

(22) Filed: Feb. 27, 2018

(65) Prior Publication Data

US 2018/0190741 A1    Jul. 5, 2018

(30) Foreign Application Priority Data

Aug. 31, 2017 (CN) .............................. 201710774168

(51) Int. Cl.
  *H01L 27/32* (2006.01)
  *H01L 51/52* (2006.01)
(52) U.S. Cl.
  CPC ...... *H01L 27/3246* (2013.01); *H01L 27/3276* (2013.01); *H01L 51/5218* (2013.01); *H01L 51/5228* (2013.01); *H01L 51/5234* (2013.01)
(58) Field of Classification Search
  CPC ............. H01L 27/3244; H01L 27/3246; H01L 27/3283; H01L 51/0026

USPC ........................................ 257/40; 438/82, 99
See application file for complete search history.

(56) References Cited

U.S. PATENT DOCUMENTS

| 2016/0254455 A1* | 9/2016 | Wang ................ H01L 51/5234 438/23 |
| 2016/0276619 A1* | 9/2016 | Cheng ..................... H01L 51/56 |

FOREIGN PATENT DOCUMENTS

CN           105633297 A       6/2016

* cited by examiner

*Primary Examiner* — Long K Tran
(74) *Attorney, Agent, or Firm* — Kilpatrick Townsend & Stockton, LLP

(57) ABSTRACT

The disclosure discloses a display panel and a display device. Since at least a part of the transparent areas includes the transparent auxiliary electrode electrically connected with the cathode in the adjacent pixel display area and extends to a top of the cathode auxiliary wire to be electrically connected with the cathode auxiliary wire, i.e., the cathode is electrically connected with the cathode auxiliary wire via the transparent auxiliary electrode, resistance of the cathode is reduced by the use of the transparent auxiliary electrode. Furthermore, since the transparent auxiliary electrode is arranged in a transparent area, neither the size of the at least one pixel display area is reduced, nor the transparent function of the transparent areas is affected.

18 Claims, 9 Drawing Sheets

--PRIOR ART--

DISPLAY PANEL AND DISPLAY DEVICE

CROSS-REFERENCE TO RELATED APPLICATIONS

This application claims the priority to Chinese Patent Application No. CN201710774168.1, filed on Aug. 31, 2017, the content of which is hereby incorporated by reference in its entirety.

FIELD

The present disclosure relates to the field of display technologies, and particularly to a display panel and a display device.

BACKGROUND

Organic Light-Emitting Diode (OLED) displays have become a hot spot for flat panel display research. Compared with a Liquid Crystal Display (LCD), an OLED display has lower power consumption, a lower production cost, a wider viewing angle, a faster response speed and is self-luminous. In presently existing technology, OLED displays have come to take the place of traditional LCDs in flat panel displays such as mobile phones, Personal Digital Assistants (PDAs) and digital cameras.

Since no separate light source is required by an OLED display, the thickness thereof is small and it can operate as a transparent display device capable of displaying an image thereon.

SUMMARY

In view of this, the embodiment of the disclosure provides a display panel and a display device, configured to address the problem in existing OLED display devices of non-uniform brightness by lowering resistance of a cathode without degrading a pixel aperture ratio.

An embodiment of the disclosure provides a display panel including an array substrate. The array substrate includes at least two transparent areas arranged in a matrix and at least one pixel display area between adjacent transparent areas.

A cathode over a light-emitting layer, the light-emitting layer over an anode, the anode over the array substrate and a pixel definition layer for defining the light-emitting layer are arranged in the pixel display area.

A transparent auxiliary electrode over the array substrate and electrically connected with a cathode in an adjacent pixel display area is arranged in at least a part of the transparent areas.

A cathode auxiliary wire arranged over the array substrate and insulated from the anode is arranged in the pixel display area.

The transparent auxiliary electrode extends to a top of the cathode auxiliary wire and is electrically connected with the cathode auxiliary wire.

Correspondingly the embodiment of the disclosure further provides a display device including a display panel. The display panel including an array substrate and the array substrate including at least two transparent areas arranged in a matrix and at least one pixel display area between adjacent transparent areas. The pixel display area has a cathode over a light-emitting layer, the light-emitting layer over an anode, the anode over the array substrate and a pixel definition layer for defining the light-emitting layer. At least a part of the transparent areas has a transparent auxiliary electrode arranged over the array substrate and electrically connected with a cathode in an adjacent pixel display area. A cathode auxiliary wire arranged over the array substrate and insulated from the anode is arranged in the pixel display area. And the transparent auxiliary electrode extends to a top of the cathode auxiliary wire and is electrically connected with the cathode auxiliary wire.

The display panel and the display device according to the embodiment of the disclosure include the at least two transparent areas and the at least one pixel display area. Since at least a part of the transparent areas includes the transparent auxiliary electrode, which is electrically connected with the cathode in the adjacent pixel display area and extends to the top of the cathode auxiliary wire to be electrically connected with the cathode auxiliary wire, i.e., the cathode is electrically connected with the cathode auxiliary wire via the transparent auxiliary electrode, resistance of the cathode is reduced by the use of the transparent auxiliary electrode. Furthermore, since the transparent auxiliary electrode is arranged in a transparent area, neither the size of the at least one pixel display area is reduced, nor the transparent function of the transparent areas is affected. Moreover, since the transparent auxiliary electrode is arranged in a transparent area, whose size is large comparing with a pixel display area, the size of the transparent auxiliary electrode can also be made large to thereby greatly reducing the resistance of the transparent auxiliary electrode so as to avoid the problem of non-uniform brightness due to too large resistance of the transparent auxiliary electrode.

DETAILED DESCRIPTION OF THE EMBODIMENTS

Figure 1:
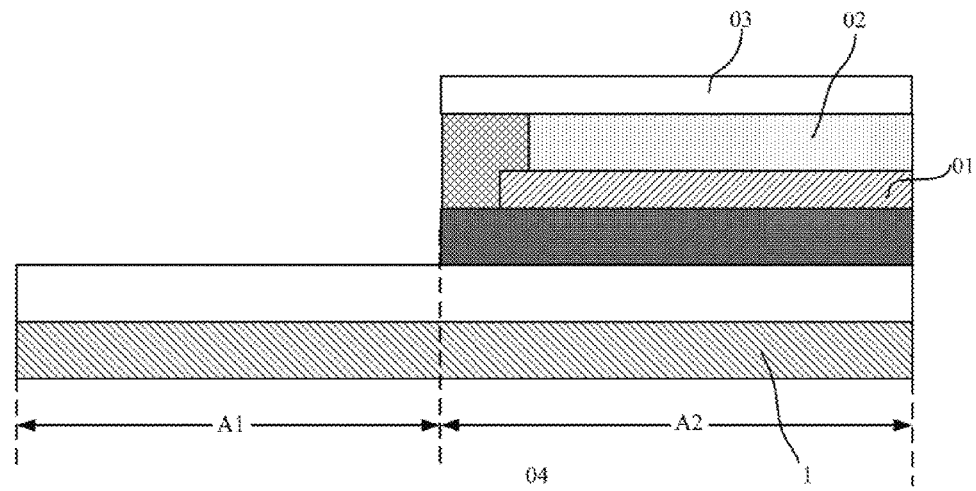
FIG. 1 is a schematic structural diagram of an existing transparent OLED display device in a sectional view.

The shapes and sizes of each component in the drawings are not intended to reflect a real proportion, but are only intended to illustrate the content of the disclosure.

FIG. 1 is a schematic structural diagram of an existing transparent display device, where the transparent OLED display device includes an array substrate 1 including a pixel display area A2 and a transparent area A1 configured to transmit a background view through the OLED display device. In the pixel display area A2, a cathode 03 is arranged over a light-emitting layer 02, and light-emitting layer 02 is arranged over an anode 01. Light emitted from the light-emitting layer 02 exits the cathode 03 side. In the pixel display area A2, the thickness of the cathode 03 may need to be very small to improve the transmissivity of the cathode 03. However a decrease in thickness of the cathode 03 may come with an increase in resistance thereof, thus resulting in the problem of non-uniform display brightness.

Figure 2:
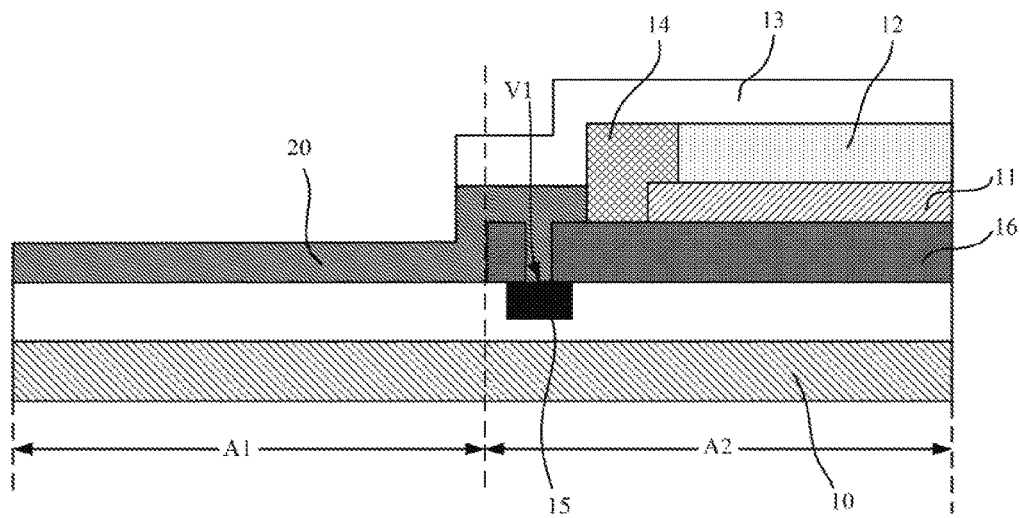
FIG. 2 is a schematic structural diagram of a display panel according to an embodiment of the disclosure in a sectional view.

An embodiment of the disclosure provides a display panel as illustrated in FIG. 2 which is a schematic structural diagram of the display panel in a sectional view. The display panel includes an array substrate 10 including at least two transparent areas A1 arranged in a matrix, and at least one pixel display area A2 between adjacent transparent areas A1.

Each pixel display area A2 includes a cathode 13 over a light-emitting layer 12, the light-emitting layer 12 over an anode 11, the anode 11 arranged over the array substrate 10, and a pixel definition layer 14 for defining the light-emitting layer 12.

At least a part of the transparent area A1 has a transparent auxiliary electrode 20 arranged over the array substrate 10, which is electrically connected with a cathode 13 in an adjacent pixel display area A2.

A cathode auxiliary wire 15 over the array substrate 10 and insulated from the anode 11 is also arranged in each pixel display area A2.

The transparent auxiliary electrode 20 extends to a top of the cathode auxiliary wire 15 and is electrically connected with the cathode auxiliary wire 15.

The display panel according to the embodiment of the disclosure includes the at least two transparent areas and the at least one pixel display area. Since at least a part of the transparent areas includes the transparent auxiliary electrode, which is electrically connected with the cathode in the adjacent pixel display area and extends to the top of the cathode auxiliary wire to be electrically connected with the cathode auxiliary wire, i.e., the cathode is electrically connected with the cathode auxiliary wire via the transparent auxiliary electrode, resistance of the cathode is reduced by the use of the transparent auxiliary electrode. Furthermore, since the transparent auxiliary electrode is arranged in a transparent area, neither the size of the at least one pixel display area is reduced, nor the transparent function of the transparent areas is affected. Moreover, since the transparent auxiliary electrode is arranged in a transparent area, whose size is large comparing with a pixel display area, the size of the transparent auxiliary electrode can also be made large to thereby greatly reducing the resistance of the transparent auxiliary electrode so as to avoid the problem of non-uniform brightness due to too large resistance of the transparent auxiliary electrode.

In one embodiment, in the display panel according to the embodiment of the disclosure, generally a film made of an insulated material is further arranged between the transparent auxiliary electrode and the cathode auxiliary wire, so the transparent auxiliary electrode and the cathode auxiliary wire are generally electrically connected through a via hole.

In one embodiment, since an array of thin film transistors is arranged over the array substrate, making the surface thereof uneven, if the anode, the light-emitting layer and the cathode are formed directly over the uneven surface in that order, the ratio of qualified products may decrease, so the display panel according to the embodiment of the disclosure as illustrated in FIG. 2 further includes a planarization layer 16 between the array substrate 10 and the anode 11.

The cathode auxiliary wire 15 is arranged between the planarization layer 16 and the array substrate 10, and the transparent auxiliary electrode 20 is electrically connected with the cathode auxiliary wire 15 through a via hole V1 running through the planarization layer 16.

In one embodiment, in the display panel according to the embodiment of the disclosure, a planarization layer may be arranged between a transparent auxiliary electrode and an array substrate in a transparent area, or of course, no planarization layer is arranged between the two, although the embodiment of the disclosure is not limited thereto.

In one embodiment, the display panel according to the embodiment of the disclosure is a top-emitting organic light-emitting display panel, that is, the anode is a reflecting electrode, the cathode is a transparent electrode, and light emitted from the light-emitting layer exits the cathode side.

In one embodiment, in the display panel according to the embodiment of the disclosure, the reflecting electrode generally includes a reflecting layer and a transparent conductive layer. The reflecting layer can be made of a metal with a high reflectivity such as silver, nickel, gold, platinum, aluminum, copper, molybdenum, aluminum neodymium or an alloy thereof. Since the anode may need to provide the light-emitting layer with holes, the transparent conductive layer can be made of a transparent conductive oxide with a high work function such as Indium tin oxide, indium zinc oxide, indium tin zinc oxide, zinc oxide, or tin oxide.

Figure 3:
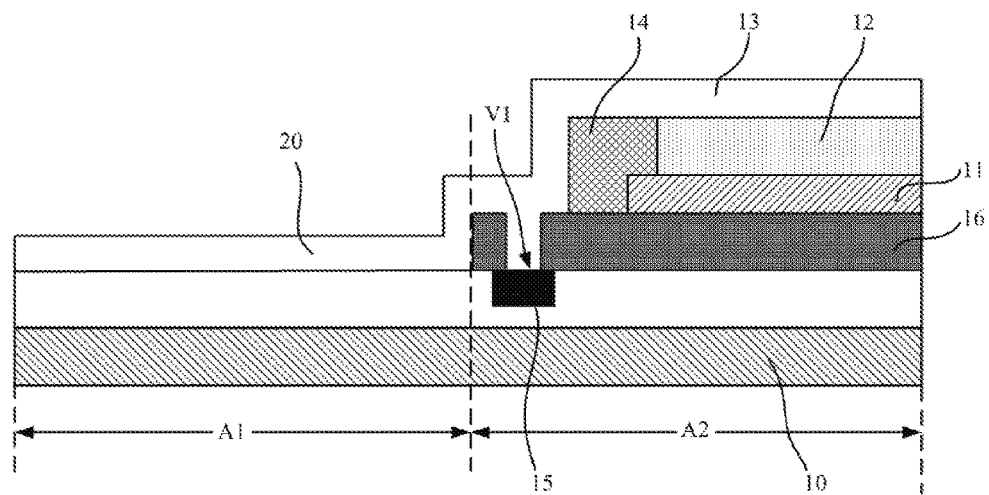
FIG. 3 is a schematic structural diagram of another display panel according to the embodiment of the disclosure in a sectional view.

In one embodiment, in another display panel according to the embodiment of the disclosure, as illustrated in FIG. 3 which is a schematic structural diagram of the display panel in a sectional view, the transparent auxiliary electrode 20 is integrated with the cathode 13 in the adjacent pixel display area A2.

Thus when manufacturing the display panel, the order of films formation is as follows: forming the cathode auxiliary wire; forming the planarization layer; forming the anode; forming the light-emitting layer; forming the cathode and the transparent auxiliary electrode simultaneously. Hence a separate process of fabricating the transparent auxiliary electrode is avoided and the fabrication cost is reduced.

In one embodiment, in the OLED display panel, the light-emitting layer generally includes a hole injection layer, a hole transmission layer, a light-emitting functional layer, an electron transmission layer and an electron injection layer. When fabricating the light-emitting layer, the light-emitting functional layer is made of different materials corresponding to pixels of different colors; the other film layers except the light-emitting functional layer can share a common film layer and thus are formed in the layer as a whole. At present, the light-emitting layer is generally formed through vapor plating, which means an area where the light-emitting layer is not to be formed is shielded by a mask. Therefore, the opening of a mask used for forming the common film layer in the light-emitting layer corresponds to the entire panel, whereas a mask used for forming the light-emitting functional layer is a Fine Metal Mask (FFM). Since the FFM is fabricated in a complex process at a high cost, in addition, it is difficult to control alignment accuracy of the FFM, in order not to decrease the ratio of qualified products, the OLED display panel may be manufactured using as the FFM as infrequently as possible.

In one embodiment, in the display panel according to the embodiment of the disclosure, when the transparent auxiliary electrode is integrated with the cathode in the adjacent pixel display area, the transparent area A1 may be arranged without the light-emitting layer and the anode, as illustrated in FIG. 3.

Figure 4:
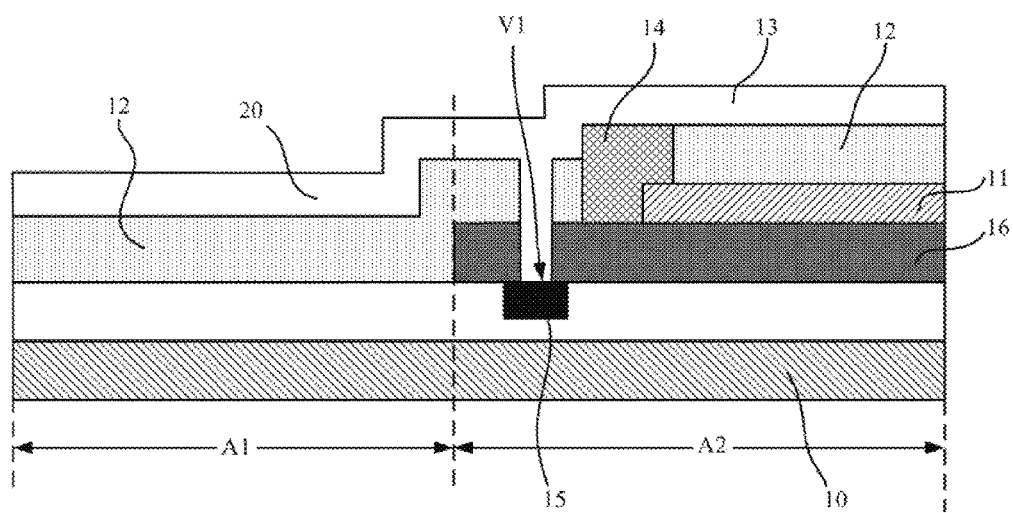
FIG. 4 is a schematic structural diagram of a further display panel according to the embodiment of the disclosure in a sectional view.
Figure 5:
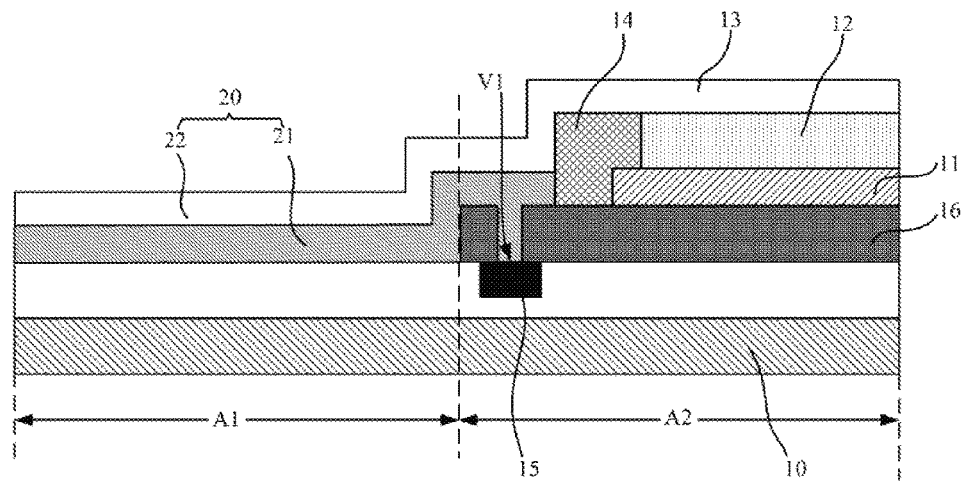
FIG. 5 is a schematic structural diagram of a further display panel according to the embodiment of the disclosure in a sectional view.

Since generally the light-emitting layer allows light to pass through, alternatively as illustrated in FIG. 4, which is a schematic structural diagram of another display panel according to the embodiment of the disclosure in a sectional vie the light-emitting layer 12 in the transparent area A1 is maintained, and the transparent auxiliary electrode 20 is electrically connected with the cathode auxiliary wire 15 through a via hole V1 running through the light-emitting layer 12 and the planarization layer 16, so that the via hole can be formed in the light-emitting layer 12 after the light-emitting layer 12 is formed in the transparent area A1 without changing the existing process of forming the light-emitting layer 12 in a display panel. Potentially no FFM may need to be added in the method according to this embodiment. In a specific implementation, the maintained light-emitting layer 12 in the transparent area A1 is a bit different from the light-emitting layer in the pixel display area. The light-emitting layer in the pixel display area includes a common film layer and a light-emitting functional layer, e.g., it includes a hole injection layer, a hole transmission layer, a light-emitting functional layer, an electron transmission layer and an electron injection layer. Whereas the light-emitting layer in the transparent area includes only a common film layer, e.g., it includes a hole injection layer, a hole transmission layer, an electron transmission layer and an electron injection layer. In order to further reduce the resistance of the transparent auxiliary electrode, in the display panel according to the embodiment of the disclosure as illustrated in FIG. 5, which is a schematic structural diagram of another display panel according to the embodiment of the disclosure in a sectional view, the transparent auxiliary electrode 20 includes a second electrode 22 arranged over a first electrode 21 and the first electrode 22 arranged over the array substrate.

The second electrode 22 is integrated with the cathode 13 in the adjacent pixel display area A2.

The first electrode 21 is electrically connected with the cathode auxiliary wire 15 through a via hole V1.

In this way, the transparent auxiliary electrode is comprised of the first electrode and the second electrode, and the resistance of the transparent auxiliary electrode is further reduced by increasing the number of electrode layers in the transparent auxiliary electrode. Furthermore the second electrode is integrated with the cathode, and when fabricating the cathode of the display panel, the cathode film layers in both the pixel display area and the transparent area are kept, so a separate process of fabricating the second electrode in the transparent auxiliary electrode is avoided and the fabrication cost is lowered.

In one embodiment, when manufacturing the display panel, the first electrode can be formed before the planarization layer is formed. Then the order of films formation is as follows: forming the cathode auxiliary wire; forming the first electrode; forming the planarization layer; forming the anode; forming the light-emitting layer; forming the cathode and the second electrode. Of course, the first electrode can alternatively be formed after the planarization layer is formed and before the anode layer is formed. Then the order of films formation is as follows: forming the cathode auxiliary wire; forming the planarization layer; forming the first electrode; forming the anode; forming the light-emitting layer; and forming the cathode and the second electrode.

In one embodiment, when the OLED display panel is manufactured, the anode, film layers such as the common film layer of the light-emitting layer and the cathode are formed as a whole in a same layer, and in the display panel according to the embodiment of the disclosure, the transparent auxiliary electrode in the transparent area is conductive, and the light-emitting layer is made of an organic material with a low electrical conductivity. Therefore in the display panel according to the embodiment of the disclosure, it is optional that the light-emitting layer is not formed in the transparent area during the vapor plating process, the cathode in the transparent area and the transparent conductive layer in the anode are maintained as the transparent auxiliary electrode.

Figure 6:
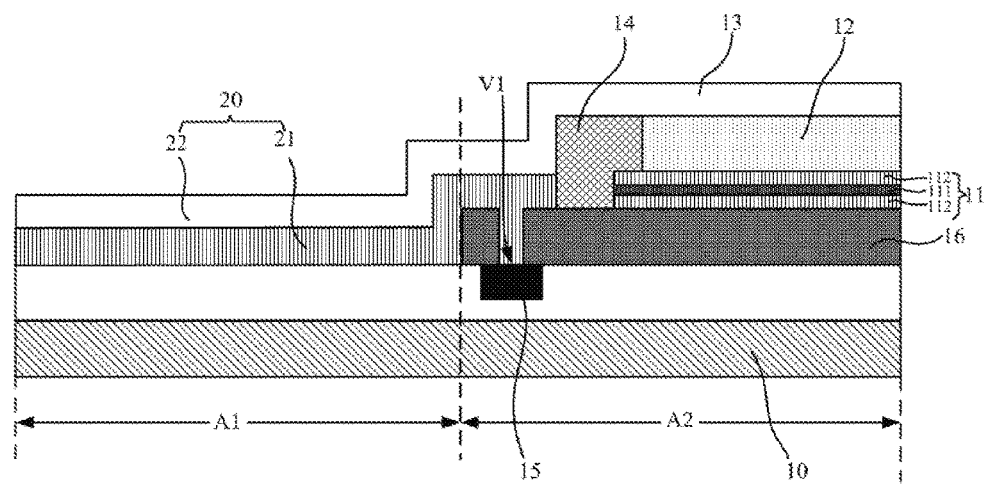
FIG. 6 is a schematic structural diagram of a further display panel according to the embodiment of the disclosure in a sectional view.

In one embodiment, in the display panel according to the embodiment of the disclosure, as illustrated in FIG. 6, which is a schematic structural diagram of another display panel according to the embodiment of the disclosure in a sectional view, the anode 11 includes at least one reflecting layer 111 and at least one transparent conductive layer 112 in a stack. For example, the anode 11 in FIG. 5 is structured like a sandwich including one reflecting layer 111 and two transparent conductive layers 112.

The first electrode 21 and a transparent conductive layer 112 in the anode 11 are arranged in a same layer and made of a same material, so that when fabricating the display panel, the order of films formation is as follows: forming the cathode auxiliary wire; forming the planarization layer; forming the anode and the first electrode, forming the light-emitting layer; forming the cathode and the second electrode simultaneously. In this way the first electrode and the transparent conductive layer in the anode can be formed in a same patterning process by simply modifying the pattern of a mask without an additional separate process of fabricating the first electrode, thus lowering a fabrication cost.

In the display panel according to the embodiment of the disclosure, although the second electrode and the transparent conductive layer in the anode can be fabricated in the same layer to dispense with a patterning process, the reflecting layer in the transparent area may need to be etched in the fabrication process. But the transparent conductive layer acting as the second electrode tends to be etched away together with the reflecting layer, thus degrading the electrical conductivity of the transparent auxiliary electrode. Since this degrading can be avoided by fabricating the second electrode separately, which adds an additional patterning process, the process of fabricating the second electrode can be determined according to the actual situation.

Figure 7:
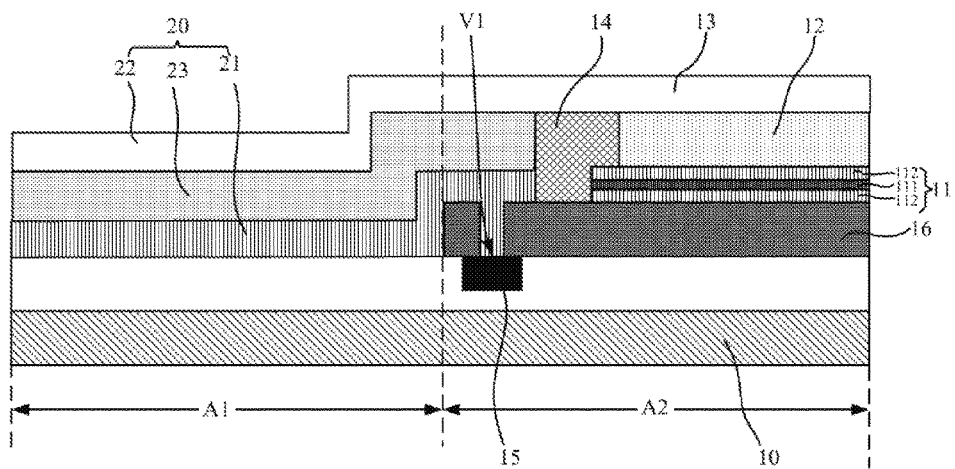
FIG. 7 is a schematic structural diagram of a further display panel according to the embodiment of the disclosure in a sectional view.

In one embodiment, in the display panel according to the embodiment of the disclosure, since if no light-emitting layer is formed in the transparent area, the number of times the FFM is used may increase, the ratio of qualified products may decrease, and the cost may increase, in the display panel according to the embodiment of the disclosure as illustrated in FIG. 7, which is a schematic structural diagram of another display panel according to the embodiment of the disclosure in a sectional view, the transparent auxiliary electrode 20 further includes an electrically-conductive light-emitting layer 23 processed for an improved electrical conductivity and arranged between the first electrode 21 and the second electrode 22.

The material of the electrically-conductive light-emitting layer 23 before it is processed for an improved electrical conductivity is partially the same as the material of the light-emitting layer 12 in the pixel display area A2.

In this way, the FFM may be used less frequently, and only the light-emitting layer in the transparent area may need to be processed for an improved electrical conductivity to make the connection between the first electrode and the second electrode conductive.

In a one implementation, any process of processing the light-emitting layer for an improved electrical conductivity to convert the light-emitting layer into an electrically-conductive light-emitting layer shall fall into the scope of the disclosure as claimed, and an example thereof is described below with reference to the embodiment illustrated in FIG. 8.

Figure 8:
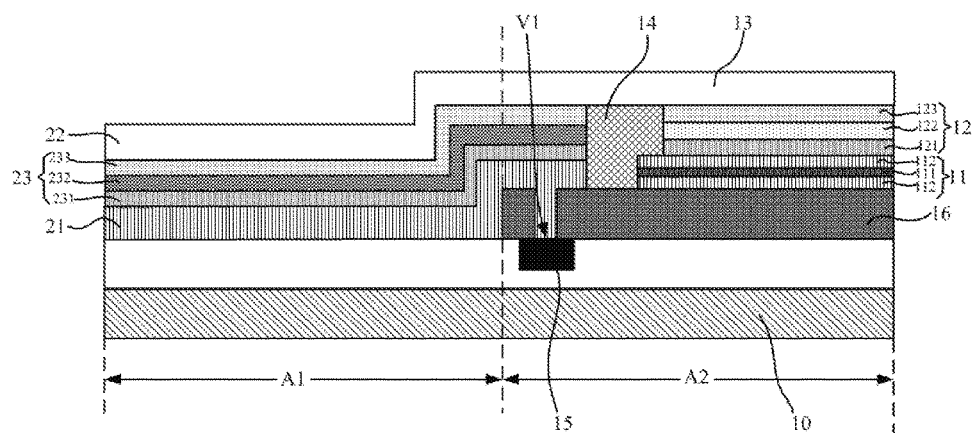
FIG. 8 is a schematic structural diagram of a further display panel according to the embodiment of the disclosure in a sectional view.

In one embodiment, in the display panel according to the embodiment of the disclosure, as illustrated in FIG. 8, which is a schematic structural diagram of another display panel according to the embodiment of the disclosure in a sectional view, the light-emitting layer 12 includes a second organic layer 123 over a light-emitting functional layer 122, the light-emitting functional layer 122 over a first organic layer 121, and the first organic layer 121 over the anode 11.

The electrically-conductive light-emitting layer 23 includes a fourth organic layer 233 over a carrier generation layer 232, the carrier generation layer 232 over a third organic layer 231 and the third organic layer 231 arranged over the first electrode 21.

The third organic layer 232 is arranged at a same layer as the first organic layer 121 and both are made of a same material. The fourth organic layer 233 is arranged at a same layer as the second organic layer 123 and both are made of a same material.

In this way, the electrically-conductive light-emitting layer is formed in the operations of: forming patterns of the third organic layer and the first organic layer in one patterning process; forming a pattern of the light-emitting functional layer in the pixel display area; forming a pattern of the carrier generation layer in the transparent area; and forming patterns of the second organic layer and the fourth organic layer in one patterning process. In this way the light-emitting functional layer is not vapor-plated in the transparent area, and the FFM is used for vapor-plating the carrier generation layer in the transparent area. Comparing with using the FFM for additional several times when the light-emitting layer is not formed in the transparent area, in the implementation the FFM may only need to be used one more time, thus lowering the cost and improving the ratio of qualified products.

In one embodiment, in the display panel according to the embodiment of the disclosure, the light-emitting functional layer refers to a film layer at which electrons and holes are recombined. The first organic layer includes at least a hole transmission layer, and the second organic layer includes at least an electron transmission layer.

In one embodiment, in the display panel according to the embodiment of the disclosure, in order to improve the efficiency of light emission, the first organic layer further includes a hole injection layer, and the second organic layer further includes an electron injection layer.

In one embodiment, in the display panel according to the embodiment of the disclosure, the material of the carrier generation layer includes molybdenum trioxide, a compound of molybdenum trioxide and magnesium, a compound of aluminum and lithium fluoride, or HAT-CN.

In one embodiment, in the display panel according to the embodiment of the disclosure, the array substrate includes a base substrate, and at least one metal electrode layer arranged over the base substrate, e.g., a data line, a gate line, a source, a drain, or a gate of a thin film transistor.

The cathode auxiliary wire is arranged at a same layer and made of a same material as a metal electrode layer furthest away from the base substrate. A long distance between the cathode auxiliary wire and the base substrate means a short distance between the cathode auxiliary wire and the transparent auxiliary electrode, which means the thickness of a film layer between the cathode auxiliary wire and the transparent auxiliary electrode is small, thus reducing the depth of the via holes through which the cathode auxiliary wire is electrically connected with the transparent auxiliary electrode.

Figure 9:
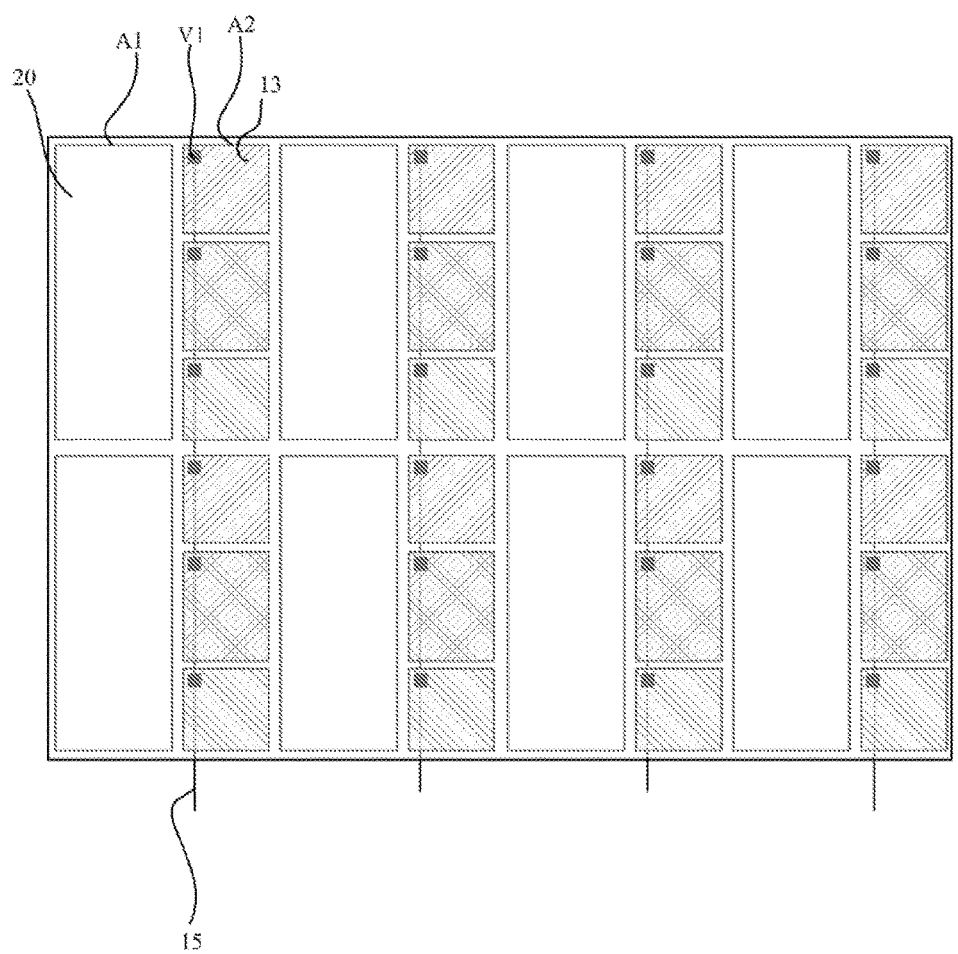
FIG. 9 is a schematic structural diagram of a display panel according to the embodiment of the disclosure in a top view.

In one embodiment, as illustrated in FIG. 9, which is a schematic structural diagram of a display panel according to the embodiment of the disclosure in a top view, the transparent areas A1 are distributed in rows and columns, and a transparent auxiliary electrode 20 is arranged in each transparent area A1, so the total area of the transparent auxiliary electrodes 20 in the display panel is increased to reduce the resistance of the cathode 13 as much as possible.

In one embodiment, in the display panel according to the embodiment of the disclosure, a via hole can be arranged in each pixel display area to connect the transparent auxiliary electrode with the cathode auxiliary wire, or of course, a via hole can be arranged in a part of the pixel display areas to connect the transparent auxiliary electrode(s) with the cathode auxiliary wire(s), although the embodiment of the disclosure is not limited thereto.

In one embodiment, in the display panel according to the embodiment of the disclosure, as illustrated in FIG. 9, when the transparent auxiliary electrodes 20 are electrically connected with the cathode auxiliary wires 15 through the via holes V1, a via hole V1 is arranged in each pixel display area A2 to connect the transparent auxiliary electrode 20 with the cathode auxiliary wire 15 to further reduce the resistance between the cathode 13 and the cathode auxiliary wire 15.

Figure 10:
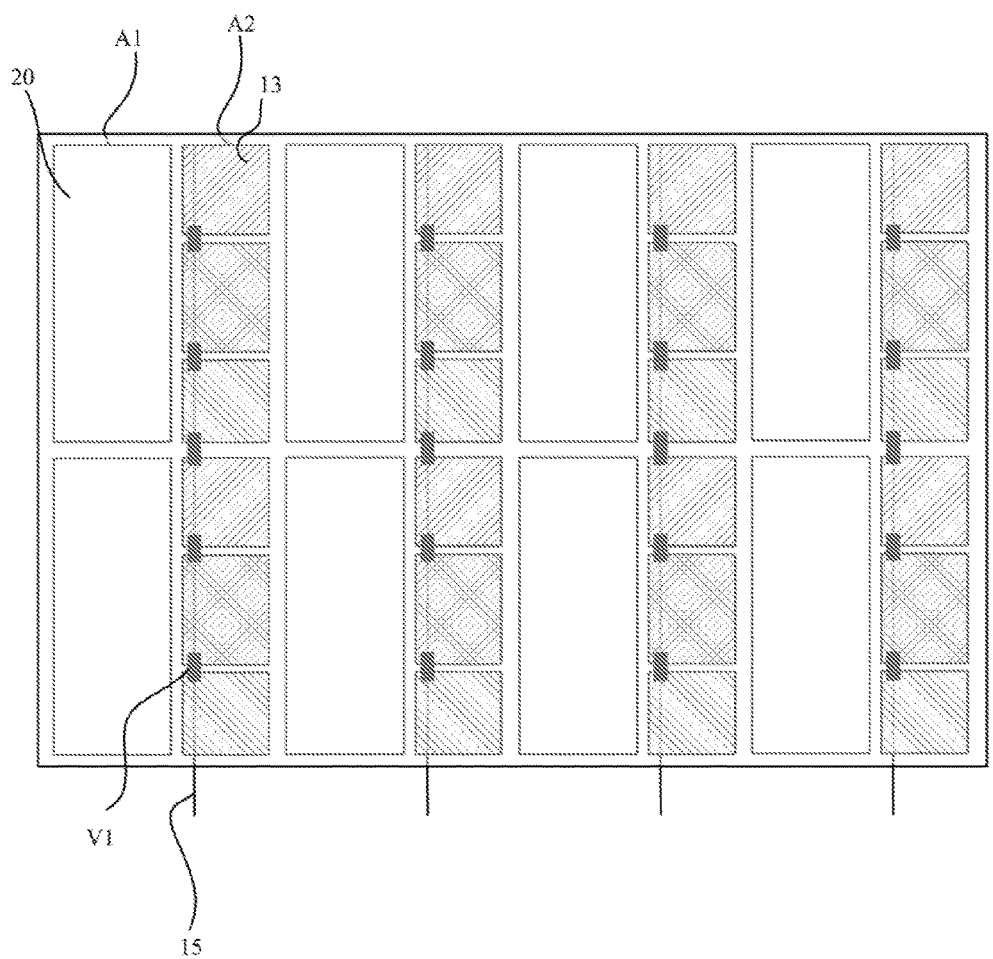
FIG. 10 is a schematic structural diagram of another display panel according to the embodiment of the disclosure in a top view.

In one embodiment, as illustrated in FIG. 10, which is a schematic structural diagram of another display panel according to the embodiment of the disclosure in a top view, one common via hole V1 is shared between adjacent pixel display areas A2 to connect the transparent auxiliary electrodes 20 with the cathode auxiliary wires 15 to reduce the number of via holes V1 and lower the complexity of the process.

In one embodiment, the display panel according to the embodiment of the disclosure includes pixel display areas of at least three different colors, e.g., a red pixel display area, a green pixel display area and a blue pixel display area, and of course, also possibly a white pixel display area or a yellow pixel display area, although the embodiment of the disclosure is not limited thereto.

In one embodiment, in the display panel according to the embodiment of the disclosure, a via hole is arranged only in a pixel display area in one of the colors to connect a transparent auxiliary electrode with a cathode auxiliary wire. For example, a via hole is arranged only in a red pixel display area to connect a transparent auxiliary electrode with a cathode auxiliary wire, or a via hole is arranged only in a green pixel display area to connect a transparent auxiliary electrode with a cathode auxiliary wire, or a via hole is arranged only in a blue pixel display area to connect a transparent auxiliary electrode with a cathode auxiliary wire, although the embodiment of the disclosure is not limited thereto.

In one embodiment, in the display panel according to the embodiment of the disclosure, the color of the pixel display area where a via hole is arranged can be determined according to the sizes of the pixel display areas in the different colors or according to their efficiencies of light emission.

Figure 11:
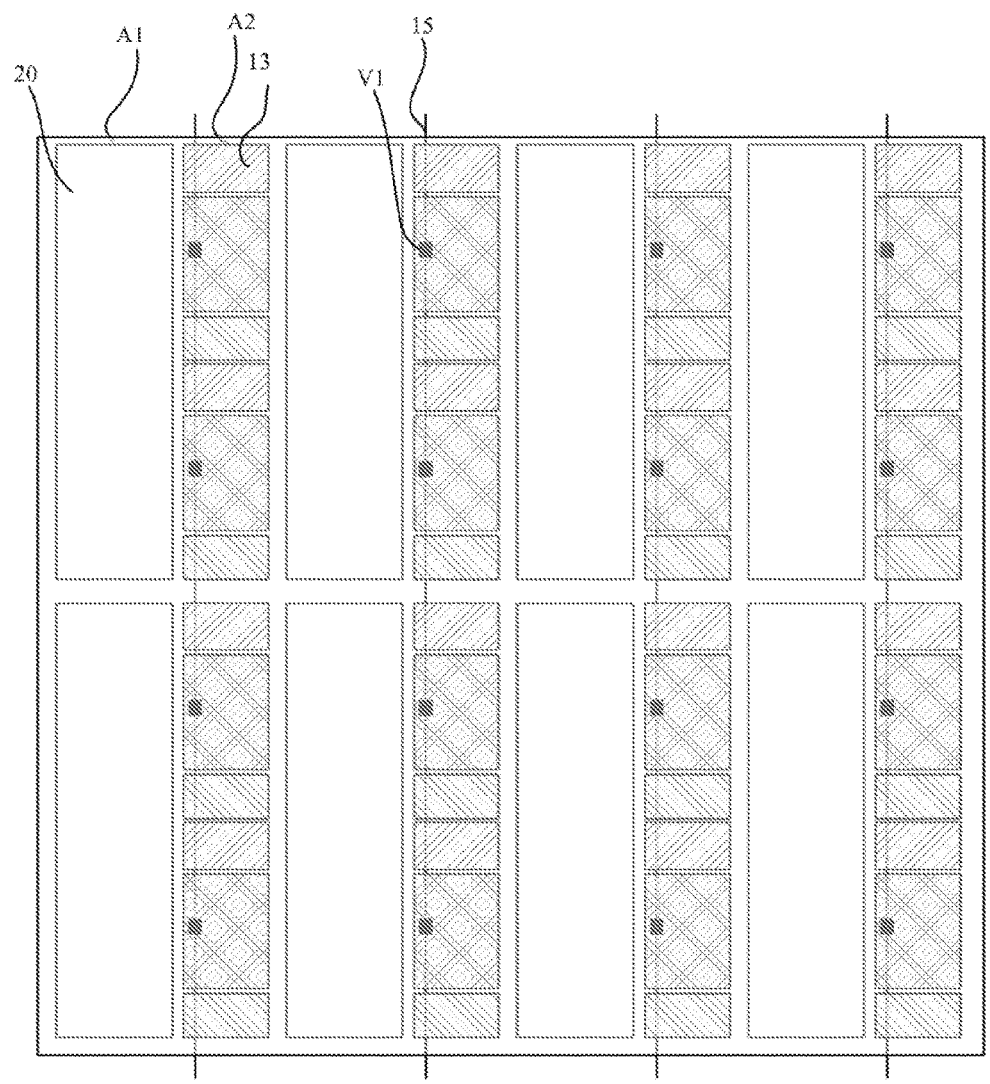
FIG. 11 is a schematic structural diagram of a further display panel according to the embodiment of the disclosure in a top view.

In one embodiment, as illustrated in FIG. 11, which is a schematic structural diagram of another display panel according to the embodiment of the disclosure in a sectional view, a via hole V1 running through the planarization layer 16 is arranged in a pixel display area A2 having the largest size.

In one embodiment, in the display panel according to the embodiment of the disclosure, since generally the efficiency of light emission from a blue pixel is the lowest, usually the size of a blue pixel display area is set larger than the size of a red pixel display area and larger than the size of a green pixel display area. So a via hole may be arranged only in a blue pixel display area having the largest size to connect the transparent auxiliary electrodes with the cathode auxiliary wires, although the embodiment of the disclosure is not limited thereto.

In one embodiment, in the display panel according to the embodiment of the disclosure, a via hole is arranged in a pixel display area having the highest efficiency of light emission to connect the transparent auxiliary electrodes with the cathode auxiliary wires. Generally the efficiency of light emission in a green pixel display area in the display panel is the highest, so a via hole may be arranged only in a green pixel display area to connect the transparent auxiliary electrodes with the cathode auxiliary wires, although the embodiment of the disclosure is not limited thereto.

In one embodiment, in the display panel according to the embodiment of the disclosure, as illustrated in FIG. 9 to FIG. 11, pixel display areas A2 are arranged between two adjacent columns of transparent areas A1 extending in a first direction, and a plurality of pixel display areas A2 are arranged between two adjacent transparent areas A1 in a second direction. The first direction is a direction of rows, and the second direction is a direction of columns. Or the first direction is a direction of columns, and the second direction is a direction of rows. In FIG. 9 to FIG. 11, for example, the first direction is a direction of rows, and the second direction is a direction of columns.

In one embodiment, in FIG. 9 and FIG. 10, for example, three pixel display areas A2 are arranged between two adjacent transparent areas A1 in each row of transparent areas A1. In FIG. 11, six pixel display areas A2 are arranged between two adjacent transparent areas A1 in each row of transparent areas A1, although the embodiment of the disclosure is not limited thereto.

In one embodiment, in the display panel according to the embodiment of the disclosure, generally, a direction of rows is an extension direction of gate lines, and a direction of columns is an extension direction of data lines, although the embodiment of the disclosure is not limited thereto.

Figure 12:
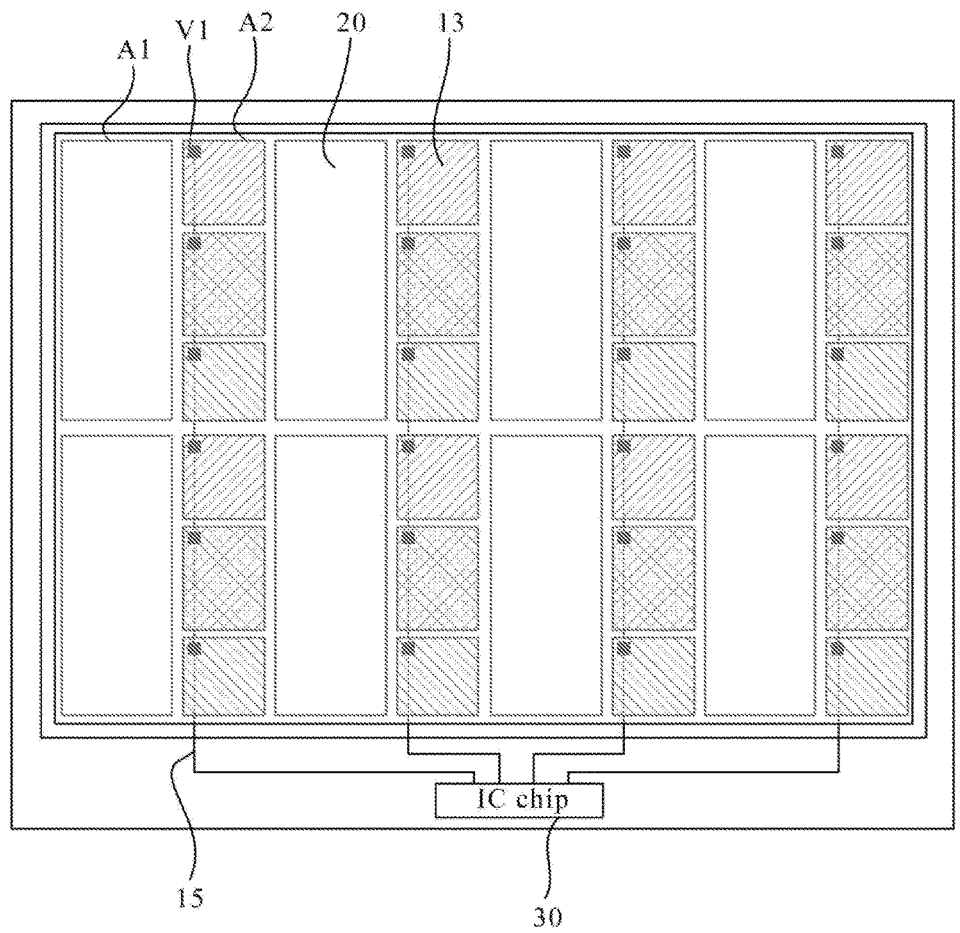
FIG. 12 is a schematic structural diagram of a further display panel according to the embodiment of the disclosure in a top view.

In one embodiment, as illustrated in FIG. 12, which is a schematic structural diagram of a display panel according to the embodiment of the disclosure in a top vie the display panel includes a display area and a frame edge area surrounding the display area. Cathode auxiliary wires 15 are connected with an IC chip located in the frame edge area of the display panel to provide the cathodes 13 with a cathode signal.

It shall be noted that all the transparent auxiliary electrodes 20 and all the cathodes 13 are integrated, i.e., in the same film layer, throughout the top views illustrated in FIG. 9 to FIG. 12, although the embodiment of the disclosure is not limited thereto as described on.

Figure 13:
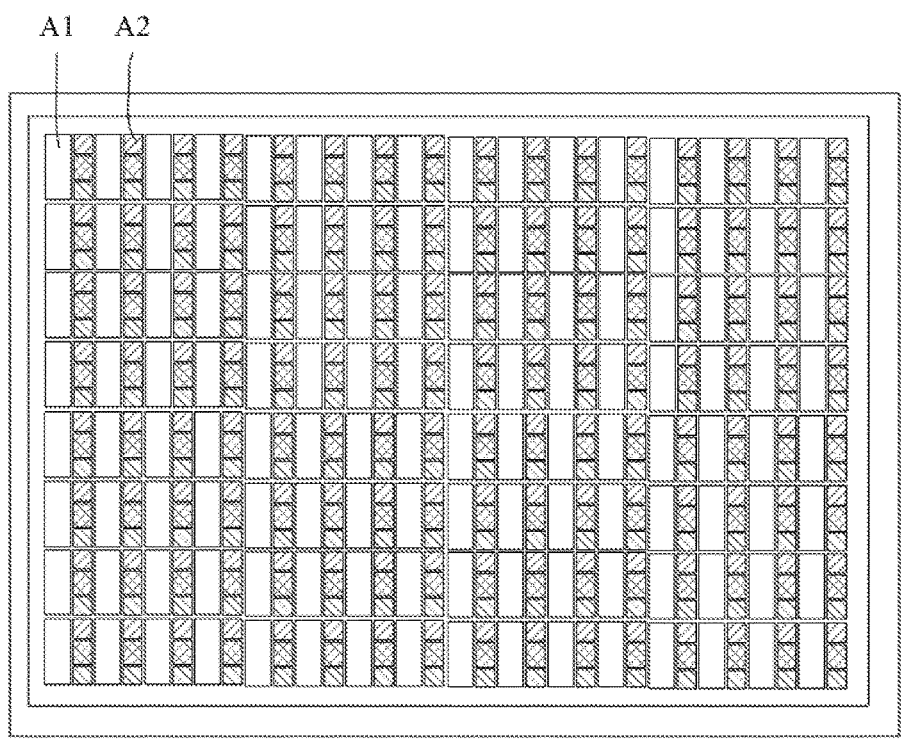
FIG. 13 is a schematic structural diagram of a display device according to the embodiment of the disclosure.

In a further embodiment of the disclosure further provides a display device as illustrated in FIG. 13, which is a schematic structural diagram of the display device. The display device includes any one of the above-mentioned display panels according to the embodiment of the disclosure. Since the display device addresses the problem using a principle similar to principle used by the above-mentioned display device, reference can be made to the implementation of the above-mentioned display panel for an implementation of the display device, and a repeated description thereof is omitted here.

The display panel and the display device according to the embodiment of the disclosure include the at least two transparent areas and the at least one pixel display area. Since at least a part of the transparent areas includes the transparent auxiliary electrode, which is electrically connected with the cathode in the adjacent pixel display area and extends to the top of the cathode auxiliary wire to be electrically connected with the cathode auxiliary wire, i.e., the cathode is electrically connected with the cathode auxiliary wire via the transparent auxiliary electrode, resistance of the cathode is reduced by the use of the transparent auxiliary electrode. Furthermore, since the transparent auxiliary electrode is arranged in a transparent area, neither the size of the at least one pixel display area is reduced, nor the transparent function of the transparent areas is affected. Moreover, since the transparent auxiliary electrode is arranged in a transparent area, whose size is large comparing with a pixel display area, the size of the transparent auxiliary electrode can also be made large to thereby greatly reducing the resistance of the transparent auxiliary electrode so as to avoid the problem of non-uniform brightness due to too large resistance of the transparent auxiliary electrode.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising;
an array substrate comprising at least two transparent areas arranged in a matrix and at least one pixel display area between adjacent transparent areas, wherein:
the pixel display area has a cathode over a light-emitting layer, the light-emitting layer over an anode, the anode over the array substrate and a pixel definition layer for defining the light-emitting layer;
at least a part of the transparent areas has a transparent auxiliary electrode arranged over the array substrate and electrically connected with a cathode in an adjacent pixel display area;
a cathode auxiliary wire arranged over the array substrate and insulated from the anode is arranged in the pixel display area; and
the transparent auxiliary electrode extends to a top of the cathode auxiliary wire and is electrically connected with the cathode auxiliary wire;
wherein the transparent auxiliary electrode and the cathode auxiliary wire are electrically connected through a via hole;

wherein the display panel comprises a planarization layer arranged between the array substrate and the anode; and the cathode auxiliary wire is arranged between the planarization layer and the array substrate, and the transparent auxiliary electrode is electrically connected with the cathode auxiliary wire through the via hole running through the planarization layer.

2. The display panel according to claim 1, wherein the anode is a reflecting electrode and the cathode is a transparent electrode.

3. The display panel according to claim 2, wherein the transparent auxiliary electrode is integrated with the cathode in the adjacent pixel display area.

4. The display panel according to claim 2, wherein the transparent auxiliary electrode comprises a second electrode over a first electrode and the first electrode over the array substrate, wherein:

the second electrode is integrated with the cathode in the adjacent pixel display area; and the first electrode is electrically connected with the cathode auxiliary wire through a via hole.

5. The display panel according to claim 4, wherein the anode comprises at least one reflecting layer and at least one transparent conductive layer arranged in a stack; and the first electrode and a transparent conductive layer in the anode are arranged at a same layer and are made of a same material.

6. The display panel according to claim 4, wherein the transparent auxiliary electrode further comprises an electrically-conductive light-emitting layer processed for an improved electrical conductivity and arranged between the first electrode and the second electrode; and a material of the electrically-conductive light-emitting layer before it is processed for the improved electrical conductivity is partially the same as a material of the light-emitting layer in the pixel display area.

7. The display panel according to claim 5, wherein the transparent auxiliary electrode further comprises an electrically-conductive light-emitting layer processed for an improved electrical conductivity and arranged between the first electrode and the second electrode; and a material of the electrically-conductive light-emitting layer before it is processed for the improved electrical conductivity is partially the same as a material of the light-emitting layer in the pixel display area.

8. The display panel according to claim 6, wherein he light-emitting layer comprises a second organic layer over a light-emitting functional layer, the light emitting functional layer over a first organic layer, the first organic layer over the anode; and the electrically-conductive light-emitting layer comprises a fourth organic layer over a carrier generation layer, the carrier generation layer over a third organic layer and the third organic layer over the first electrode;

wherein the third organic layer and the first organic layer are arranged in a same layer and are made of a same material, and the fourth organic layer and the second organic layer are arranged in a same layer and are made of a same material.

9. The display panel according to claim 8, wherein the material of the carrier generation layer is molybdenum trioxide, a compound of molybdenum trioxide and magnesium, a compound of aluminum and lithium fluoride, or HAT-CN.

10. The display panel according to claim 8, wherein the first organic layer at least comprises a hole transmission layer, and the second organic layer at least comprises an electron transmission layer.

11. The display panel according to claim 1, wherein the array substrate comprises a base substrate and at least one layer of a metal electrode over the base substrate; and the cathode auxiliary wire and a layer of a metal electrode furthest away from the base substrate are arranged at a same layer and are made of a same material.

12. The display panel according to claim 1, wherein the transparent auxiliary electrode is arranged in each of the transparent areas.

13. The display panel according to claim 12, wherein when the transparent auxiliary electrode is electrically connected with the cathode auxiliary wire through a via hole, the via hole is arranged in each pixel display area.

14. The display panel according to claim 1, wherein a via hole is shared by adjacent pixel display areas to connect the transparent auxiliary electrode with the cathode auxiliary wire.

15. The display panel according to claim 1, wherein the display panel comprises pixel display areas in at least three different colors, and the via hole is arranged in a pixel display area with a largest size among all the pixel display areas.

16. The display panel according to claim 1, wherein the display panel comprises pixel display areas in at least three different colors, and the via hole is arranged in a pixel display area with a highest efficiency of light emission among all the pixel display areas.

17. The display panel according to claim 1, wherein a pixel display area is arranged between two adjacent columns of transparent areas extending in a first direction, and at least two pixel display areas are arranged between two adjacent transparent areas in a second direction; and the first direction is a direction of rows and the second direction is a direction of columns; or the first direction is a direction of columns and the second direction is a direction of rows.

18. A display device, comprising: a display panel comprising an array substrate, the array substrate comprising at least two transparent areas arranged in a matrix and at least one pixel display area between adjacent transparent areas, wherein:

the pixel display area has a cathode over a light-emitting layer, the light-emitting layer over an anode, the anode over the array substrate and a pixel definition layer for defining the light-emitting layer;

at least a part of the transparent areas has a transparent auxiliary electrode arranged over the array substrate and electrically connected with a cathode in an adjacent pixel display area;

a cathode auxiliary wire arranged over the array substrate and insulated from the anode is arranged in the pixel display area; and the transparent auxiliary electrode extends to a top of the cathode auxiliary wire and is electrically connected with the cathode auxiliary wire;

wherein the transparent auxiliary electrode and the cathode auxiliary wire are electrically connected through a via hole;

wherein the display panel comprises a planarization layer arranged between the array substrate and the anode; and the cathode auxiliary wire is arranged between the planarization layer and the array substrate, and the transparent auxiliary electrode is electrically connected with the cathode auxiliary wire through the via hole running through the planarization layer.

\* \* \* \* \*